(12) United States Patent
Kim et al.

(10) Patent No.: US 7,577,025 B2
(45) Date of Patent: Aug. 18, 2009

(54) SEMICONDUCTOR MEMORY DEVICE COMPRISING FLOATING BODY MEMORY CELLS AND RELATED METHODS OF OPERATION

(75) Inventors: Jin-Young Kim, Guro-gu (KR); Ki-Whan Song, Gangnam-gu (KR); Duk-Ha Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 51 days.

(21) Appl. No.: 11/841,058

(22) Filed: Aug. 20, 2007

(65) Prior Publication Data

US 2008/0101115 A1    May 1, 2008

(30) Foreign Application Priority Data

Oct. 27, 2006    (KR) ...................... 10-2006-0105265

(51) Int. Cl.
*G11C 11/34* (2006.01)
(52) U.S. Cl. ........................ 365/184; 365/207; 365/222; 365/174
(58) Field of Classification Search ................. 365/184, 365/207, 222, 174
See application file for complete search history.

(56) References Cited

U.S. PATENT DOCUMENTS

| 5,822,264 A * | 10/1998 | Tomishima et al. ......... 365/222 |
| 6,825,524 B1 | 11/2004 | Ikehashi et al. |
| 6,882,008 B1 | 4/2005 | Ohsawa |
| 2003/0231524 A1 | 12/2003 | Ohsawa |
| 2004/0058506 A1 | 3/2004 | Fukuzumi |
| 2005/0068807 A1 | 3/2005 | Ohsawa |
| 2005/0226070 A1 * | 10/2005 | Ohsawa ...................... 365/207 |
| 2007/0159903 A1 * | 7/2007 | Kim et al. .................... 365/207 |

FOREIGN PATENT DOCUMENTS

| JP | 2004335883 | 11/2004 |
| JP | 2005302234 | 10/2005 |
| KR | 1020030015823 A | 2/2003 |

* cited by examiner

*Primary Examiner*—Hoai V Ho
*Assistant Examiner*—Jay Radke
(74) *Attorney, Agent, or Firm*—Volentine & Whitt, PLLC

(57) ABSTRACT

A semiconductor device comprising floating body memory cells performs read and write operations by selectively connecting bit lines and inverted bit lines to sense bit lines and inverted sense bit lines.

23 Claims, 6 Drawing Sheets and BLK2, bit line selectors 10-11 through 10-1$m$ and 10-21 through 10-2$m$, reference bit line selectors 12-1 and 12-2, level limiters 14-1 through 14-$m$, and 14-($m$+1), sense amplifiers 16-1 through 16-$m$, a reference voltage generator 18, comparators COM1 through COM$m$, latches LA1 through LA$m$, write back gates WBG1 through WBG$m$, read column selection gates RG1 through RG$m$, write column selection gates WG1 through WG$m$, and a reference write column selection gate RWG.

SEMICONDUCTOR MEMORY DEVICE COMPRISING FLOATING BODY MEMORY CELLS AND RELATED METHODS OF OPERATION

CROSS-REFERENCE TO RELATED APPLICATIONS

This application claims priority to Korean Patent Application No. 10-2006-0105265, filed Oct. 27, 2006, the disclosure of which is hereby incorporated by reference in its entirety.

BACKGROUND OF THE INVENTION

1. Field of the Invention

Embodiments of the present invention relate generally to semiconductor memory devices. More particularly, embodiments of the invention relate to semiconductor memory devices comprising floating body memory cells.

2. Description of Related Art

Researchers continue to seek new ways of increasing the integration density and performance of semiconductor memory cell arrays. One recent proposal for creating smaller memory cell arrays focuses on replacing conventional dynamic random access memory (DRAM) cells with so-called "floating body memory cells".

In a floating body memory cell, electrical charges are stored in a floating body of a floating body transistor. However, charges tend to leak out of the floating body over time and therefore the floating body transistor must be periodically refreshed. In this respect, floating body memory cells are similar to DRAM cells, which also must be periodically refreshed. However, because floating body transistors do not require both a storage capacitor and an access transistor, as DRAM cells do, floating body transistors tend to be smaller than DRAM cells.

Figure (FIG.) 1 is a schematic diagram of a conventional semiconductor memory device comprising floating body memory cells.

Referring to FIG. 1, the conventional semiconductor memory device comprises memory cell array blocks BLK1 and BLK2, bit line selectors 10-11 through 10-1$m$ and 10-21 through 10-2$m$, reference bit line selectors 12-1 and 12-2, level limiters 14-1 through 14-$m$, and 14-($m$+1), sense amplifiers 16-1 through 16-$m$, a reference voltage generator 18, comparators COM1 through COM$m$, latches LA1 through LA$m$, write back gates WBG1 through WBG$m$, read column selection gates RG1 through RG$m$, write column selection gates WG1 through WG$m$, and a reference write column selection gate RWG.

Memory cell array blocks BLK1 and BLK2 comprise respective sub-memory cell array blocks SBLK11 through SBLK1$m$ and SBLK21 through SBLK2$m$ each comprising storage memory cells, and reference memory cell array blocks RBLK1 and RBLK2 each comprising reference memory cells. Write and read operations of the storage memory cells and the reference memory cells will be described in further detail below. For explanation purposes, the operation of a reference memory cell labeled RMC will be described. Other reference memory cells function similar to reference memory cell RMC. Similarly, the operation of a storage memory cell MC will be described. Other storage memory cells function similar to storage memory cell MC.

In a write operation for writing data in reference memory cell RMC, a word line WL11 is enabled by applying a voltage of about 1.5 V thereto, and reference bit line selection signal RBS1 is enabled. As a result, a reference bit line RBL1 is connected to a reference sense bit line RSBL. A reference write column selection signal RWCSL is enabled, and a N-channel metal-oxide semiconductor (NMOS) transistor N7 is turned on so that write data apparent on a write data line WD is transmitted through reference sense bit line RSBL to reference bit line RBL1. Where the write data on write data line WD has a voltage level of about −1.5 V, data "0" is written to reference memory cell RMC connected between the word line WL11 and reference bit line RBL1. By similar operations, data "0" can be written to reference memory cells connected between the remaining word lines WL12 through WL1$n$ and reference bit line RBL1.

Similarly, data "1" can be written to reference memory cells connected between word lines WL11 through WL1$n$ and WL21 through WL2$n$ and a reference bit line RBL2 by applying a voltage of about 1.5 V to write data line WD.

In other words, data "0" is written to reference memory cells connected to reference bit line RBL1 within each of reference memory cell array blocks RBLK1 and RBLK2, while data "1" is written to reference memory cells connected to reference bit line RBL2 within each of reference memory cell array blocks RBLK1 and RBLK2. The data stored in the reference memory cells is used to generate a reference voltage VRED for read operations of storage memory cells.

In a write operation of storage memory cell MC, a voltage of about 1.5 V is applied to word line WL11, and a bit line selection signal BS1 is enabled. As a result, a bit line BL1 is connected to a sense bit line SBL1. Where a write column selection signal WCSL1 is enabled, an NMOS transistor N6 is turned on. At this time, when a voltage of about −1.5 V is applied to write data line WD, the voltage of about −1.5V is transmitted through sense bit line SBL1 to bit line BL1, so that data "0" is written to storage memory cell MC connected between word line WL1 and bit line BL1.

On the other hand, where a voltage of about 1.5 V is applied to write data line WD, data "1" is written to storage memory cell MC connected between word line WL1 and bit line BL1. Using similar operations, data can be written to all storage memory cells in memory cell array blocks BLK1 and BLK2.

In a read operation of storage memory cell MC, a voltage of about 1.5V is applied to word line WL11 and bit line selection signal BS1 is enabled. As a result, bit line BL1 is connected to sense bit line SBL1 and a signal is transmitted from bit line BL1 to sense bit line SBL1. Here, reference bit line selection signals RBS1 and RBS2 are concurrently enabled, and thus reference bit lines RBL1 and RBL2 are connected to reference sense bit line RSBL, and a signal is transmitted from reference bit lines RBL1 and RBL2 to reference sense bit line RSBL.

Where a voltage level of sense bit line SBL1 due to a current supplied to sense bit line SBL1 is at a higher level than a restricted voltage VBLR, level limiter 14-1 prevents the flow of current from its output node a1 to sense bit line SBL1 such that the voltage level of sense bit line SBL1 remains below the level of restricted voltage VBLR, and generates a current Ic1 corresponding to data stored in storage memory cell MC.

Where a voltage level of reference sense bit line RSBL is higher than restricted voltage VBLR due to a current supplied to reference sense bit line RSBL, level limiter 14-($m$+1) prevents the flow of current from its output node a($m$+1) to the reference sense bit line RSBL such that the voltage level of reference sense bit line RSBL remains below the level of restricted voltage VBLR, and generates a current Ic($m$+1) corresponding to data stored in reference memory cell RMC.

Sense amplifier 16-1 senses current Ic1 and generates a sensing voltage Sn1. Reference voltage generator 18 senses current Ic(m+1) and generates a reference voltage VREF. Comparator COM1 is enabled in response to a sense amplifier enable signal SEN, compares the sensing voltage output from sense amplifier 16-1 with reference voltage VREF and generates sensing data. Specifically, comparator COM1 outputs a high-level signal to a corresponding node "a", when sensing voltage Sn1 output from sense amplifier 16-1 is at a lower level than reference voltage VREF, and outputs a low-level signal to the corresponding node "a" when sensing voltage Sn1 is at a higher level than reference voltage VREF.

Latch LA1 latches data apparent at node "a", and when a read column selection signal RCSL1 is enabled, NMOS transistors N2 and N4 are turned on. At this time, where a voltage at the node "a" is at a high level, an NMOS transistor N5 is turned on and transmits low-level data to an inverted read data line RDB. On the other hand, where a voltage at a node "b" is at a high level, an NMOS transistor N3 is turned on and transmits low-level data to a read data line RD. In other words, low-level data is transmitted to read data line RD or inverted read data line RDB during a read operation. After the read operation is finished, a write back signal WB is enabled and an NMOS transistor N1 is turned on. Consequently, high-level data apparent at node "b" of latch LA1 is transmitted to sense bit line SBL1, and data in sense bit line SBL1 is transmitted to bit line BL1. As a result, a refresh operation is performed on storage memory cell MC connected between word line WL11 and bit line BL1 and having data "1" stored therein. Using a similar process, read operations can be performed on other storage memory cells in memory cell array blocks BLK1 and BLK2.

An example of the conventional semiconductor memory device shown in FIG. 1 is described in further detail in U.S. Patent Application Publication No. 2003/0231524. Other examples of semiconductor memory devices including memory cells and reference memory cells having floating bodies are disclosed in U.S. Patent Application Publication No. 2005/0068807 and U.S. Pat. Nos. 6,567,330 and 6,882,008.

As described above, the conventional semiconductor memory device shown in FIG. 1 includes reference memory cells storing data "0" and reference memory cells storing data "1" for performing read operations. The semiconductor memory device of FIG. 1 typically includes a single reference memory cell array block for each memory cell array block. However, the semiconductor memory device could include a reference memory cell array block for a predetermined number of sub-memory cell array blocks within each memory cell array block.

Although the conventional semiconductor memory device of FIG. 1 is designed so that reference memory cells and storage memory cells permit the flow of current corresponding to data "0" when the data "0" is read, and permit the flow of current corresponding to data "1" when the data "1" is read, the currents corresponding to the data "0" and "1" vary according to changes in fabrication process, voltage, and temperature. Unfortunately, this variance in current may result in read errors. For example, data "0" stored in memory cell MC could be read as data "1", or data "1" stored in memory cell MC could be read as data "0". Such errors result from erroneous comparisons between currents on the bit line and the reference bit line during data read operations.

In addition to the potential read errors, the conventional semiconductor memory device of FIG. 1 also requires a complicated circuit configuration for read operations. For example, the conventional semiconductor memory device requires a level limiter, a sense amplifier, a comparator, and a latch as shown in FIG. 1.

Moreover, in the conventional semiconductor memory device shown in FIG. 1, a negative voltage of −1.5 V is applied to the bit line to write data "0". Accordingly, the conventional semiconductor memory device needs a negative voltage generator for generating a negative voltage to be applied to the bit line when writing data "0".

SUMMARY OF THE INVENTION

According to one embodiment of the invention, a semiconductor memory device is provided. The semiconductor device comprises a first memory cell adapted to store a first bit of data and comprising a floating body, a gate connected to a word line, a first electrode connected to a bit line, and a second electrode connected to a first source line, a second memory cell adapted to store a second bit of data having an inverted logic state relative to the first bit of data and comprising a floating body, a gate connected to the word line, a first electrode connected to an inverted bit line, and a second electrode connected to a second source, a first transmission gate configured to turn on in response to a voltage applied to a common source line or a voltage applied to the bit line to connect the common source line with the first source line, a second transmission gate configured to turn on in response to the voltage applied to the common source line or a voltage applied to the inverted bit line to connect the common source line with the second source line, a bit line isolation gate configured to connect the bit line and the inverted bit line with a sense bit line and an inverted sense bit line, respectively, during a write operation, and further configured to connect the bit line and the inverted bit line with the inverted sense bit line and the sense bit line, respectively, and then to connect the bit line and the inverted bit line with the sense bit line and the inverted sense bit line, respectively, during a read operation, wherein the connections of the bit line and inverted bit line with the sense bit line and the inverted sense bit line are controlled by a bit line isolation control signal, and a precharge circuit configured to precharge the sense bit line and the inverted sense bit line to a precharge voltage level in response to a precharge control signal. Optionally, the semiconductor device may further comprise a bit line sense amplifier configured to receive a sense enable control signal and amplify a voltage difference between the sense bit line and the inverted sense bit line, and a column selection gate configured to transmit data between the sense bit line and a data input/output line and between the inverted sense bit line and an inverted data input/output line in response to a column selection signal.

According to another embodiment of the invention, a data read and write method for a semiconductor memory device is provided. The semiconductor device comprises a first memory cell adapted to store a first bit of data and comprising a floating body, a gate connected to a word line, a first electrode connected to a bit line, and a second electrode connected to a first source line; and a second memory cell adapted to store a second bit of data having an inverted logic state relative to the first bit of data and comprising a floating body, a gate connected to the word line, a first electrode connected to an inverted bit line, and a second electrode connected to a second source. The method comprises a data write step and a data read step. The data write step comprises amplifying signals apparent on a sense bit line and an inverted sense bit line, and transmitting the amplified signals to the bit line and the inverted bit line, respectively, to write data "1" to one of the first and second memory cells during a first write period and to write data "0" in the other of the first and second memory cells during a second write period. The data read step comprises precharging the bit line and the inverted bit line to a precharge voltage level, generating a voltage difference between the bit line and the inverted bit line and transmitting the voltage difference to the inverted sense bit line and the sense bit line during a first read period, amplifying a voltage difference between the sense bit line and the inverted sense bit line and transmitting the voltage difference to the bit line and the inverted bit line during second and third read periods to re-store data "1" in one of the first and second memory cells where the data "1" is stored, and cutting off the application of a voltage to the bit line and the inverted bit line during a fourth read period to re-store data "0" in one of the first and second memory cells where the data "0" is stored.

BRIEF DESCRIPTION OF THE DRAWINGS

Embodiments of the invention are described in relation to the accompanying drawings. Throughout the drawings like reference labels indicate like features. In the drawings.

DESCRIPTION OF EMBODIMENTS

In general, embodiments of the invention relate to semiconductor memory devices including floating body memory cells and related methods of operation.

Figure 1:
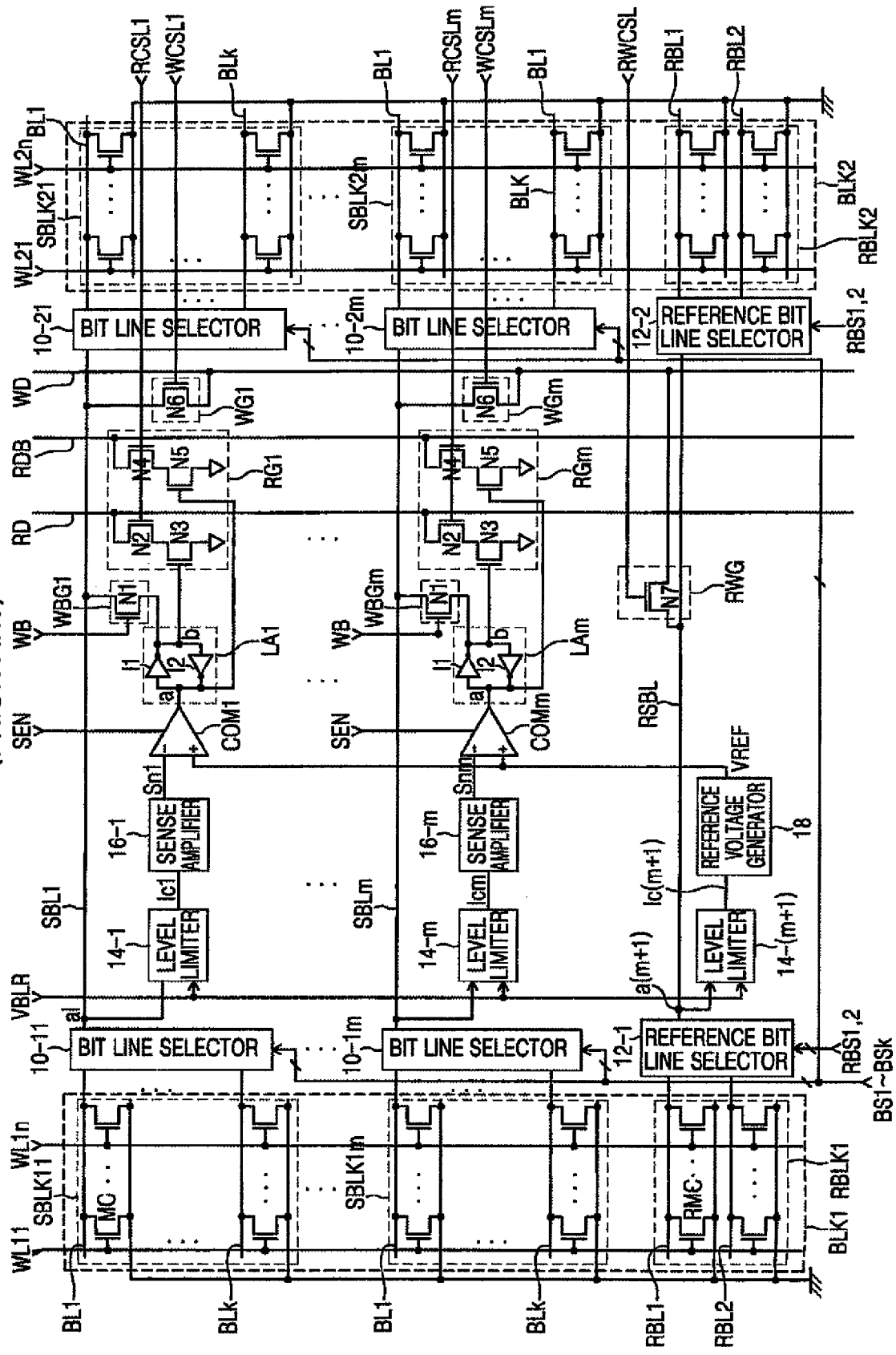
FIG. 1 is a schematic diagram of a conventional semiconductor memory device including floating body memory cells.
Figure 2:
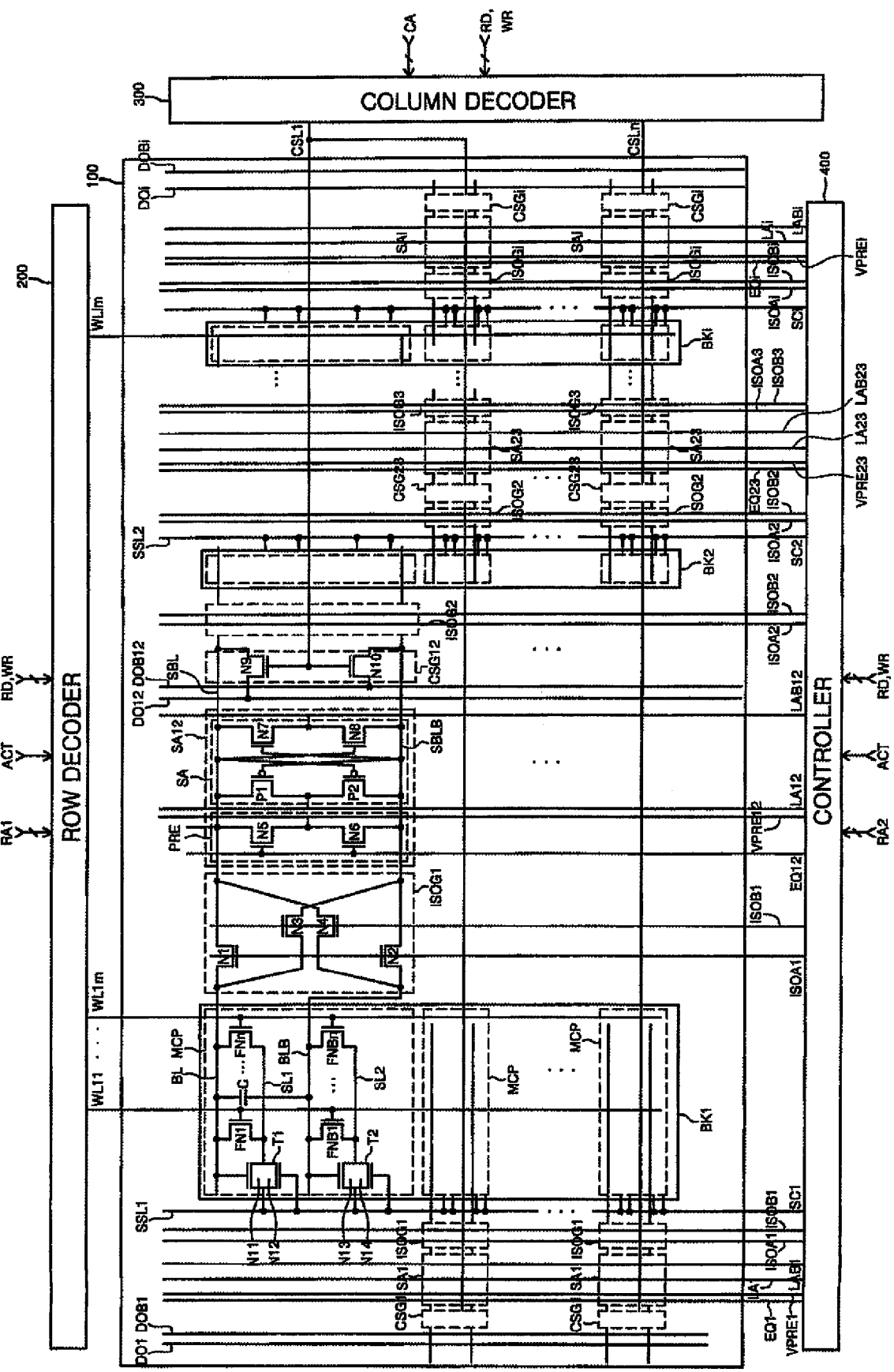
FIG. 2 is a schematic diagram of a semiconductor memory device in accordance with one embodiment of the invention.

FIG. 2 is a schematic diagram of a semiconductor memory device according to one embodiment of the invention.

Referring to FIG. 2, the semiconductor memory device comprises a memory cell array 100, a row decoder 200, a column decoder 300, and a controller 400. Memory cell array 100 comprises "i" memory cell array blocks BK1 through BKi, "i" bit line isolation gates ISOG1 through ISOGi, "i" bit line sense amplifiers SA1, SA12, SA23, . . . , and SAi, and "i" column selection gates CSG1, CSG12, CSG23, . . . , and CSGi. Each of memory cell array blocks BK1 through BKi comprises a plurality of memory pair groups MCP, and each of memory pair groups MCP comprises "n" first memory cells, "n" second memory cells, a first transmission gate T1, and a second transmission gate T2.

To explain the configuration and operation of memory pair groups MCP, a single memory pair group MCP in memory cell array block BK1 will be described. Other memory pair groups MCP are similar to the memory pair group MCP to be described, and therefore additional descriptions will be avoided where possible to avoid redundancy.

The "n" first memory cells in the illustrated memory pair group MCP of memory cell array block BK1 comprise NMOS transistors FN1 through FNn, which are floating body transistors. NMOS transistors FN1 to FNn comprise respective first electrodes (e.g., drain or source) connected to a bit line BL, respective second electrodes (e.g., drain or source) connected to a first source line SL1, and respective gates connected to word lines WL1 through WLm.

The "n" second memory cells in the illustrated memory pair group MCP of memory cell array block BK1 comprise NMOS transistors FNB1 through FNBn, which are floating body transistors. NMOS transistors FNB1 to FNBm comprise respective first electrodes connected to an inverted bit line BLB, respective second electrodes connected to a second source line SL2, and respective gates connected to word lines WL1 through WLm.

First transmission gate T1 comprises NMOS transistors N11 and N12, which have gates connected to bit line BL and a common source line SSL1, respectively, and are connected between common source line SSL1 and first source line SL1. Second transmission gate T2 comprises NMOS transistors N13 and N14, which have respective gates connected to inverted bit line BLB and common source line SSL1, and are connected between common source line SSL1 and second source line SL2.

Common source lines SSL1 through SSLi are separated from one another and respectively connected to memory cell array blocks BK1 through BKi. Each of bit line isolation gates ISOG1 to ISOGi comprises NMOS transistors N1, N2, N3, and N4, and each of bit line sense amplifiers SA1, SA12, SA23, . . . , and SAi comprises a precharge circuit PRE comprising NMOS transistors N5 and N6 and an amplification circuit SA comprising a P-channel metal-oxide semiconductor (PMOS) sense amplifier and an NMOS sense amplifier. The PMOS sense amplifier comprises PMOS transistors P1 and P2, and the NMOS sense amplifier comprises NMOS transistors N7 and N8. Also, each of column selection gates CSG1, CSG12, CSG23, . . . , and CSGi comprises NMOS transistors N9 and N10.

The operation of elements 100, 200, 300, and 400 shown in FIG. 2 is described in further detail below.

Memory cell array 100 performs a write or read operation on two pairs of memory cells connected to a selected word line and further connected to two pairs of bit lines BL and BLB selected by a column selection signal. Memory cell array block BK1 writes data transmitted through two pairs of data input/output lines (DO1, DOB1) and (DO12, DOB12) and reads stored data through the two pairs of data input/output lines (DO1, DOB1) and (DO12, DOB12). Each of memory cell array blocks BK2 through BKi inputs and outputs data through two pairs of data input/output lines located at opposing sides thereof.

Row decoder 200 receives an active command ACT, decodes a first row address RA1, and enables a word line selection signal for selecting word lines WL11 through WL1m, . . . , and WLim. Row decoder 200 may be configured such that the enabling period of the word line selection signal is fixed irrespective of a read command RD and a write command WR, or alternatively, row decoder 200 may be configured such that the enabling period of the word line selection signal varies according to read command RD and write command WR.

Column decoder 300 receives read command RD or write command WR, decodes a column address CA, and generates a column selection signal for selecting column selection signal lines CSL1 through CSLn.

Controller 400 receives active command ACT, decodes a second row address RA2 for designating memory cell array blocks BK1 through BKi, and generates bit line isolation control signals ISOA1, ISOB1, . . . , ISOAi, and ISOBi, sense enable control voltages (LA1, LAB1), (LA12, LAB12), (LA23, LAB23), . . . , and (LAi, LABi), common source control signals SC1 through SCi, precharge signals EQ1, EQ12, EQ23, . . . , and EQi, and precharge voltages VPRE1, VPRE12, VPRE23, . . . , and VPREi.

Where second row address RA2 is an address for designating memory cell array block BK1, controller 400 generates common source control signal SC1 and sense enable control voltages (LA1, LAB1) and (LA12, LAB12) with the same respective voltage levels in response to read command RD and write command WR, and outputs bit line isolation control signals ISOA1 and ISOB1 in response to read command RD and write command WR.

In addition, controller 400 controls enablement periods of bit line isolation control signals ISOA1 and ISOB1 and voltage application periods of sense enable control voltages (LA1, LAB1) and (LA12, LAB12) in response to read command RD and write command WR. In other words, controller 400 generates the sense enable control voltages with voltage levels depending on the memory cell array block designated by second row address RA2, and controls the bit line isolation gates located at opposing sides of the designated memory cell array block so that appropriate bit lines are connected to corresponding sense bit lines. Alternatively, controller 400 generates the bit line isolation control signals such that appropriate bit lines are connected to corresponding inverted sense bit lines, and generates the common source control signal of the memory cell array block designated by second row address RA2 with an appropriate voltage level.

Bit line isolation gates ISO1 through ISOi connect bit line BL with a sense bit line SBL and inverted bit line BLB with an inverted sense bit line SBLB, or connect bit line BL with inverted sense bit line SBLB and inverted bit line BLB with sense bit line SBL in response to bit line isolation control signals (ISOA1, ISOB1) to (ISOAi, ISOBi), respectively.

Bit line isolation control signals (ISOA1, ISOB1) through (ISOAi, ISOBi) are appropriately enabled in response to read command RD or write command WR when a corresponding one of memory cell array blocks BK1 through BKi is designated.

For example, where memory cell array block BK1 is designated and write command WR is received, bit line isolation control signal ISOA1 is enabled, so that NMOS transistors N1 and N2 of bit line isolation gate ISOG1 are turned on. Thus, bit line BL is connected with sense bit line SBL and inverted bit line BLB is connected with inverted sense bit line SBLB.

Where memory cell array block BK1 is designated and read command RD is applied, bit line isolation control signal ISOB1 is first enabled, so that NMOS transistors N3 and N4 of bit line isolation gate ISOG1 are turned on to connect bit line BL with inverted sense bit line SBLB and to connect inverted bit line BLB with sense bit line SBL. Thereafter, bit line isolation control signal ISOB1 is disabled for a re-storage operation, and bit line isolation control signal ISOA1 is enabled so that NMOS transistors N1 and N2 of bit line isolation gate ISOG1 are turned on to connect bit line BL with sense bit line SBL and inverted bit line BLB with inverted sense bit line SBLB.

Precharge circuits PRE of bit line sense amplifiers SA1, SA12, SA23, . . . , and SAi precharge the voltages of the corresponding pair of sense bit lines SBL and SBLB to levels of precharge voltages VPRE1, VPRE12, VPRE23, . . . , and VPREi in response to precharge control signals EQ1, EQ12, EQ23, . . . , and EQi, respectively, before and after read and write operations.

For instance, where memory cell array block BK1 is designated and read command RD is applied, precharge control signals EQ1 and EQ12 are enabled before and after the read operation. Thus, the corresponding pair of sense bit lines SBL and SBLB is precharged to precharge voltages VPRE1 and VPRE12.

Amplification circuits SA of bit line sense amplifiers SA1, SA12, SA23, . . . , and SAi sense a voltage difference between the pair of sense bit lines SBL and SBLB and amplify data of the pair of sense bit lines SBL and SBLB in response to sense enable control voltages (LA1, LAB1), (LA12, LAB12), (LA23, LAB23), . . . , and (LAi, LABi), respectively.

For instance, where memory cell array block BK1 is designated, sense enable control voltages (LA1, LAB1) and (LA12, LAB12) are applied to memory cell array block BK1, and where memory cell array block BK2 is designated, sense enable control voltages (LA12, LAB12) and (LA23, LAB23) are applied to memory cell array block BK2. Column selection gates CSG1, CSG12, CSG23, . . . , and CSGi connect sense bit lines SBL and SBLB with a corresponding pair of data input/output lines (DO1, DOB1), (DO12, DOB12), (DO23, DOB23), . . . , and (DOi, DOBi), respectively, in response to column selection signals for selecting column selection signal lines CSL1 through CSLn.

Where common source control signals SC1 through SCi with predetermined voltage level(s) are applied to common source lines SSL1 through SSLi, respectively, NMOS transistor N12 of first transmission gate T1 and NMOS transistor N14 of second transmission gate T2 are turned on and transmit the predetermined voltage level to first source line SL1 and second source line SL2. Also, NMOS transsistor N11 of first transmission gate T1 and NMOS transistor N13 of second transmission gate T2 are turned on in response to respective voltages apparent on bit line BL and inverted bit line BLB, and transmit voltages apparent on first and second source lines SL1 and SL2 to corresponding lines among common source lines SSL1 through SSLi.

Figure 3A:
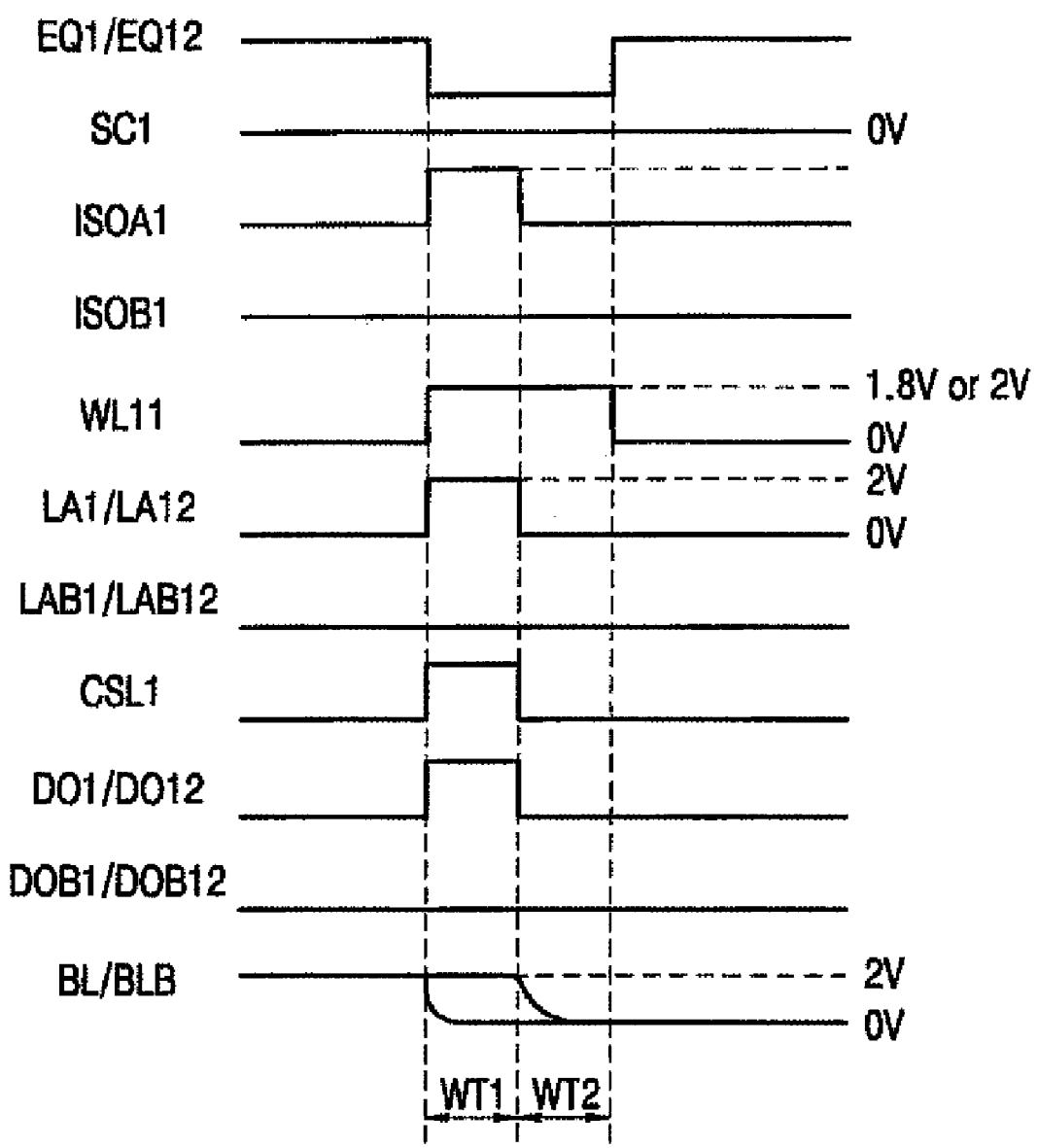
FIGS. 3A and 3B are timing diagrams respectively illustrating a write operation and a read operation of the semiconductor memory device of FIG. 2 in accordance with one embodiment of the invention.

FIG. 3A is a timing diagram illustrating a data write operation of the semiconductor memory device shown in FIG. 2 in accordance with one embodiment of the invention. In the example of FIG. 3A, first row address RA1 for selecting word line WL11 and second row address RA2 for designating memory cell array block BK1 are applied along with active command ACT, and column address CA for selecting column selection signal line CSL1 is applied along with write command WR.

During a first write period WT1, controller 400 receives second row address RA2 and generates bit line isolation control signal ISOA1 with a voltage level for turning on NMOS transistors N1 and N2 of bit line isolation gates ISOG1 located at opposite sides of memory cell array block BK1. In addition, controller 400 generates sense enable control voltages LA1 and LA12 with a predetermined voltage (e.g., about 2 V), generates sense enable control voltages LAB1 and LAB12 with predetermined voltages (e.g., about 0 V), and applies common source control signal SC1 with a predetermined voltage (e.g., about 0 V) to common source line SSL1. Column decoder 300 decodes column address CA and enables the column selection signal for selecting column selection signal line CSL1. Row decoder 200 decodes first row address RA1 and generates the word line selection signal with a predetermined voltage (e.g., about 1.8 or 2 V) for selecting word line WL11.

Column selection gates CSG1 and CSG12 are turned on in response to the column selection signal, thereby transmitting pairs of high- and low-level data of the pairs of data lines (DO1, DOB1) and (DO12, DOB12) to pairs of sense bit lines (SBL, SBLB), respectively. NMOS transistors N1 and N2 of bit line isolation gates ISOG1 are turned on in response to bit line isolation control signal ISOA1, thereby connecting the pair of sense bit lines (SBL, SBLB) with the pair of bit lines (BL, BLB).

Bit line sense amplifiers SA1 and SA12 sense a high-level voltage level of sense bit lines SBL and amplify inverted bit lines BLB and inverted sense bit lines SBLB to a predetermined voltage level (e.g., about 0V). Also, bit line sense amplifiers SA1 and SA12 sense a low-level voltage of inverted sense bit lines SBLB, and amplify bit lines BL and sense bit lines SBL to a predetermined voltage level (e.g., about 2V). Thus, NMOS transistors N11 are turned on, so that a voltage (e.g., about 0V) of common source line SSL1 is applied to first source lines SL1.

In this case, since a predetermined voltage (e.g., about 1.8 or 2V) is applied to respective gates of memory cells FN1 and FNB1 of each of the two memory pair groups of memory cell array block BK1, impact ionization happens in memory cells FN1 connected to bit line BL of each of the two memory pair groups, so that holes are accumulated in the floating bodies of memory cells FN1. As a result, data "1" is written to memory cells FN1 during first write period WT1.

Next, controller 400 disables bit line isolation control signal ISOA1, and cuts off the application of sense enable control signals (LA1, LABL1) and (LA12, LAB12). Column decoder 300 decodes column address CA, and disables the column selection signal for selecting column selection signal line CSL1.

During a second write period WT2, bit line isolation control signal ISOA1 is disabled, so that a voltage is not applied to bit lines BL of each of the two memory pair groups, and NMOS transistors N11 are turned on in response to the voltage applied to bit lines BL. Then, electric charges are emitted from bit lines BL through memory cells FN1 connected to bit lines BL of the two memory pair groups, so that the voltage level of bit lines BL is reduced. Thus, the voltage level of bit lines BL is reduced to a threshold voltage of NMOS transistor N11. Where the voltage level of bit lines BL falls below the threshold voltage, NMOS transistor N11 is turned off.

Simultaneously, memory cells FNB1 connected to inverted bit lines BLB of the two memory pair groups transmit a voltage (e.g., about 0 V) of inverted bit lines BLB. As the voltage level of bit lines BL is reduced, the voltage level of inverted bit lines BLB of the two memory pair groups is also reduced so that inverted bit lines BLB have a negative voltage. This result is obtained due to a coupling capacitor "C" connected between bit line BL and inverted bit line BLB. In this case, the voltage level of inverted bit lines BLB becomes a threshold voltage of NMOS transistor N13 or NMOS transistor N14. Thus, a forward bias voltage is applied between the floating bodies of memory cells FNB1 connected to inverted bit lines BLB of the two memory pair groups and inverted bit lines BLB. As a result, holes accumulated in the floating bodies are emitted to inverted bit lines BLB, thus writing data "0" in memory cells FNB1.

Figure 3B:
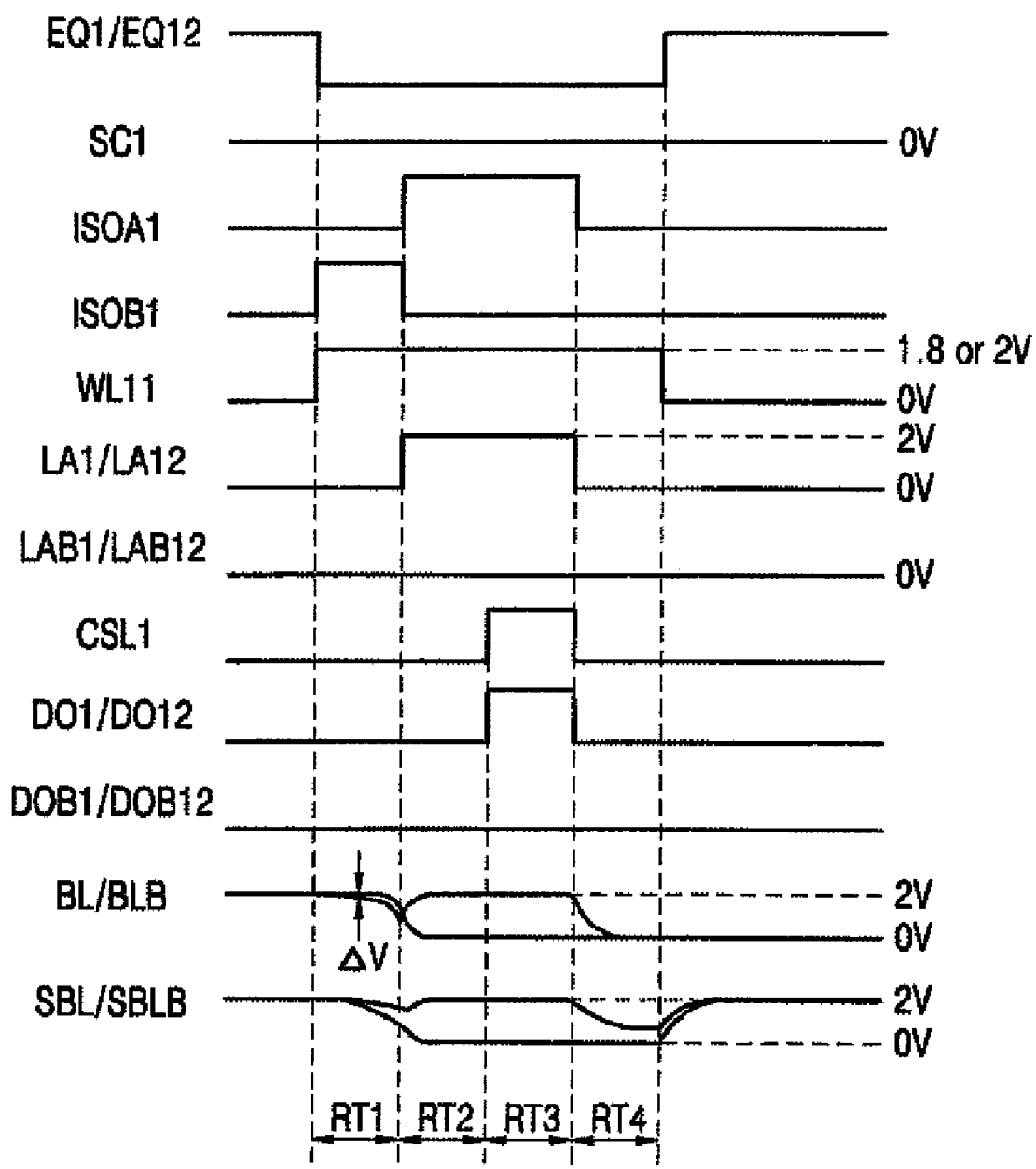

FIG. 3B is a timing diagram illustrating a data read operation of the semiconductor memory device shown in FIG. 2 in accordance with an exemplary embodiment of the invention. The data read operation is performed to read data "1" stored in memory cells FN1 of the two memory pair groups of memory cell array block BK1 and data "0" stored in memory cells FNB1 thereof as a result of the data write operation shown in FIG. 3A.

During a first read period RT1, controller 400 receives second row address RA2, generates bit line isolation control signal ISOB1 with a voltage level adapted to turn on NMOS transistors N3 and N4 of bit line isolation gates ISOG1 located at both sides of memory cell array block BK1, and applies common source control signal SC1 with a predetermined voltage (e.g., about 0 V) to common source line SSL1. Row decoder 200 decodes first row address RA1, and generates word line selection signal with a predetermined voltage (about 1.8 or 2 V) for selecting word line WL11.

Since pairs of bit lines BL and BLB have a precharge voltage level, NMOS transistors N11 and N13 of the two memory pair groups of memory cell array block BK1 are turned on. As a result, a current is supplied through memory cells FN1 and FNB1, thereby reducing the voltage level of the pairs of bit lines BL and BLB.

At this time, because data "1" is stored in memory cell FN1 and data "0" is stored in memory cell FNB1, a threshold voltage of memory cell FN1 is lower than that of memory cell FNB1. Thus, a current flowing from bit line BL through memory cell FN1 to source line SL1 is larger than a current flowing from inverted bit line BLB through memory cell FNB1 to source line SL2. As a result, the voltage level of bit line BL becomes lower than that of inverted bit line BLB to cause a voltage difference $\Delta V$.

In this case, since NMOS transistors N3 and N4 of bit line isolation gates ISOG1 are turned on, the voltage level of sense bit lines SBL becomes higher than that of inverted sense bit lines SBLB. During first read period RT1, a charge operation is performed on bit lines BL and inverted bit lines BLB of the two memory pair groups.

During a second read period RT2, controller 400 generates bit line isolation control signal ISOA1 with a voltage level for turning on NMOS transistors N1 and N2 of bit line isolation gates ISOG1, and bit line isolation control signal ISOB1 with a voltage level for turning off NMOS transistors N3 and N4 of bit line isolation gate ISOG1. Also, controller 400 supplies sense enable control voltages LA1 and LA12 with predetermined voltage levels (e.g., about 2 V) and supplies sense enable control voltages LAB1 and LAB12 with predetermined voltage levels (about 0 V), to sense amplifiers SA1 and SA12 located at opposite sides of memory cell array block BK1. Then, sense amplifiers SA1 and SA12 sense a high-level voltage of sense bit lines SBL, and amplify the voltage level of inverted sense bit lines SBLB to a predetermined voltage level (e.g., about 0 V). Also, sense amplifiers SA1 and SA12 sense a low-level voltage of inverted sense bit lines SBLB, and amplify the voltage level of sense bit lines SBL to a predetermined voltage level (e.g., about 2 V).

At this time, since NMOS transistors N1 and N2 of bit line isolation gates ISOG1 are turned on, bit lines BL and inverted bit lines BLB are also amplified to the same level as sense bit lines SBL and inverted sense bit lines SBLB. Thus, NMOS transistors N11 of the two memory pair groups are turned on, so that a predetermined voltage level (e.g., about 0V) is applied to first source lines SL1. During second read period RT2, a voltage difference between bit lines BL and inverted bit lines BLB connected to memory cells FN1 and FNB1 of the two memory pair groups of memory cell array block BK1, and a voltage difference between sense bit lines SBL and inverted sense bit lines SBLB are amplified.

During a third read period RT3, column decoder 300 decodes column address CA and generates the column selection signal for selecting column selection signal line CSL1. Then, column selection gates CSG1 and CSG12 located at both sides of memory cell array block BK1 are turned on, and transmit data in the pairs of sense bit lines SBL and SBLB of the two memory pair groups to the pairs of data input/output lines (DO1, DOB1) and (DO12, DOB12). In third read period RT3, data is transmitted between the pairs of sense bit lines (SBL, SBLB) and the pairs of data input/output lines (DO1, DOB1) and (DO12, DOB12).

Next, controller 400 generates bit line isolation control signal ISOA1 with a voltage level (e.g., about 0 V) level for turning off NMOS transistors N1 and N2 of bit line isolation gates ISOG1 located at both sides of memory cell array block BK1 and cuts off the application of sense enable control voltages LA1, LA12, LA23, . . . , and LAB12 to sense amplifiers SA1 and SA12. Column decoder 300 disables the column selection signal for selecting column selection signal line CSL1.

In second and third read periods RT2 and RT3, a predetermined voltage (e.g., about 2V) is applied to bit lines BL, so that data "1" is re-stored in memory cells FN1 connected to bit lines BL, owing to impact ionization.

During a fourth read period RT4, since the bit line isolation gates ISOG1 are turned off, a voltage is not applied to bit lines BL of each of the two memory pair groups, and NMOS transistors N11 are turned on in response to the voltage applied to the bit lines BL. Then, electric charges are emitted from bit lines BL through memory cells FN1 connected to bit lines BL of the two memory pair groups so that the voltage level of bit lies BL is reduced. The voltage level of bit lines BL is reduced to the threshold voltage of NMOS transistor N11, and when the voltage level of bit lines BL falls below the threshold voltage, NMOS transistor N11 is turned off. Simultaneously, memory cells FNB1 connected to inverted bit lines BLB of the two memory pair groups transmit a voltage (e.g., about 0 V) of inverted bit lines BL.

As the voltage level of bit lines BL is reduced, the voltage level of inverted bit lines BLB of the two memory pair groups is also reduced so that inverted bit lines BLB have a negative voltage. In this case, the voltage level of inverted bit lines BLB becomes a threshold voltage of NMOS transistor N13 or NMOS transistor N14. Thus, a forward bias voltage is applied between the floating bodies of memory cells FNB1 connected to inverted bit lines BLB of the two memory pair groups and inverted bit lines BLB. As a result, holes accumulated in the floating bodies are emitted to inverted bit lines BLB, thereby re-storing data "0" during fourth read period RT4.

Figure 4A:
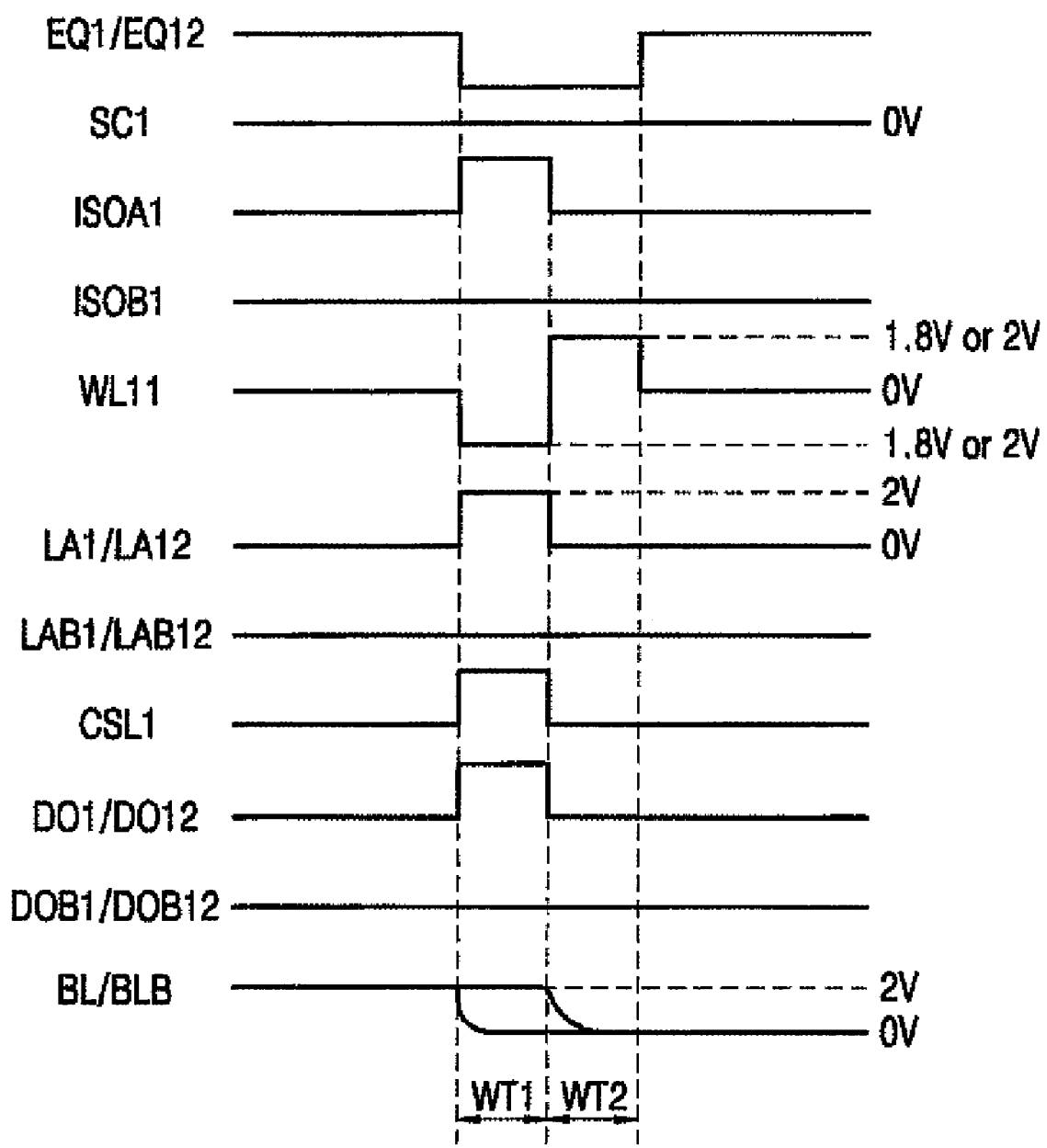
FIGS. 4A and 4B are timing diagrams respectively illustrating a write operation and a read operation of the semiconductor memory device of FIG. 2 in accordance with another embodiment of the invention.

FIG. 4A is a timing diagram illustrating a write operation of the semiconductor memory device shown in FIG. 2 in accordance with another embodiment of the invention. As in FIG. 3A, the data write operation is performed in a case where first row address RA1 for selecting word line WL11 and second row address RA2 for designating memory cell array block BK1 are applied along with active command ACT, and column address CA for selecting column selection signal line CSL1 is applied along with write command WR.

During a first write period WT1, row decoder 200 decodes first row address RA1 and generates the word line selection signal with a predetermined negative voltage (e.g., about −1.8 or −2 V) for selecting word line WL11. Controller 400 receives second row address RA2, generates bit line isolation control signal ISOA1 with a voltage for turning on NMOS transistors N1 and N2 of bit line isolation gates ISOG1 located at opposite sides of memory cell array block BK1, supplies common source control signal SC1 with a predetermined voltage (e.g., about 0 V) to common source line SSL1, and supplies predetermined sense enable control voltages LA1 and LA12 (e.g., about 2 V) and predetermined sense enable control voltages LAB1 and LAB12 (e.g., about 0 V) to bit line sense amplifiers SA1 and SA12.

Column decoder 300 decodes column address 300 and generates the column selection signal for selecting column selection signal line CSL1. Then, column selection gates CSG1 and CSG12 are turned on, and transmit pairs of high-level data and low-level data of the pairs of data lines (DO1, DOB1) and (DO12, DOB12) to the pairs of sense bit lines (SBL, SBLB), respectively. Thus, bit line sense amplifiers SA1 and SA12 amplify the pairs of data of pairs of sense bit lines SBL and SBLB, so that a voltage level of sense bit lines SBL is amplified (e.g., to about 2 V), and a voltage level of inverted sense bit line SBLB is amplified (e.g., to about 0 V).

Also, since NMOS transistors N1 and N2 of bit line isolation gates ISOG1 are turned on, the voltages of the pairs of sense bit lines SBL and SBLB are transmitted to the pairs of bit lines BL and BLB. Thus, a negative voltage is applied to the gates of memory cells FN1 of the two memory pair groups of memory cell array block BK1, and a positive voltage is applied to the respective drains thereof. As a result, a gate-induced drain leakage (GIDL) current is generated, so that holes are accumulated in the floating bodies of the memory cells FN1 to write data "1".

FIG. 3A shows a write operation in which holes are accumulated in the floating bodies of the memory cells FN1 due to impact ionization, and FIG. 4A shows a write operation in which holes are accumulated in the floating bodies of memory cells FN1 due to the GIDL current. The threshold voltage of memory cells FN1 in which data "1" is stored due to the GIDL current is similar to that of memory cells FN1 in which data "1" is stored due to impact ionization.

A write operation for storing data "0" in a second write period WT2 may be understood with reference to the operation in second write period WT2 described in FIG. 3A.

Figure 4B:
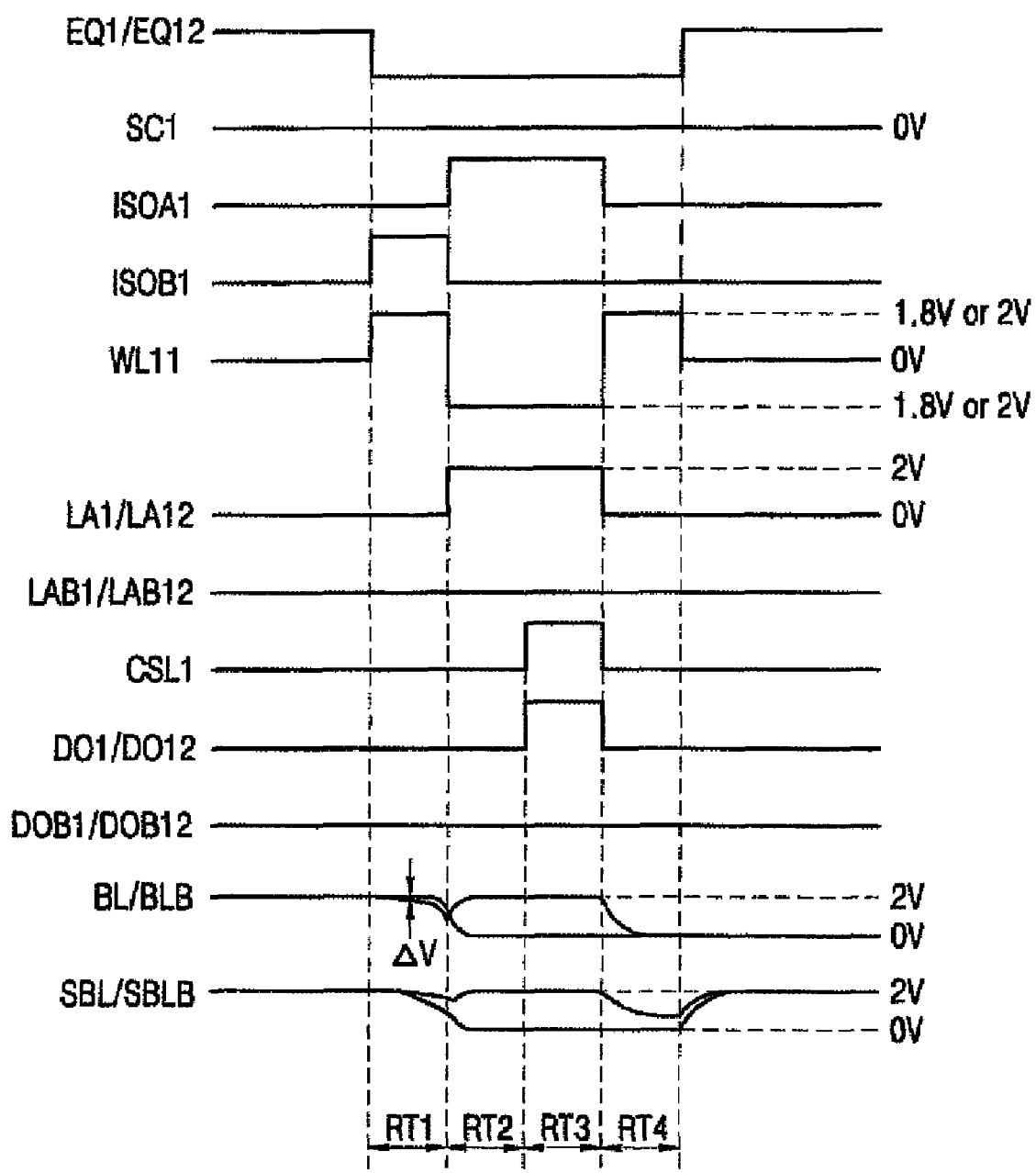

FIG. 4B is a timing diagram illustrating a data read operation of the semiconductor device shown in FIG. 2, according to another embodiment of the invention. The data read operation is performed to read the data "1" stored in memory cells FN1 of the two memory pair groups of memory cell array block BK1 and the data "0" stored in memory cells FNB1 thereof as the result of the data write operation shown in FIG. 4A.

During a first read period RT1, controller 400 receives second row address RA2, generates bit line isolation control signal ISOB1 with a voltage level for turning on NMOS transistors N3 and N4 of bit line isolation gates ISOG1 located at opposite sides of memory cell array block BK1, and generates common source control signal SC1 with a predetermined voltage (e.g., about 0 V) to common source line SSL1. Row decoder 200 decodes first row address RA1, and generates the word line selection signal with a predetermined voltage (e.g., about 1.8 or 2 V) for selecting word line WL11. Since the pairs of bit lines BL and BLB are precharged to a predetermined precharge voltage (VPRE) level, NMOS transistors N11 and N13 of the two memory pair groups of memory cell array block BK1 are turned on. As a result, a current is supplied through memory cells FN1 and FNB1, thereby reducing the voltage level of the pairs of bit lines BL and BLB.

At this time, because data "1" is stored in memory cell FN1 and data "0" is stored in memory cell FNB1, a threshold voltage of memory cell FN1 is lower than that of memory cell FNB1. Thus, a current flowing from bit line BL through memory cell FN1 to source line SL1 is larger than a current flowing from inverted bit line BLB through memory cell FNB1 to source line SL2. As a result, the voltage level of bit line BL becomes lower than that of inverted bit line BLB to produce a voltage difference ΔV. In this case, since NMOS transistors N3 and N4 of bit line isolation gates ISOG1 are turned on, the voltage level of sense bit lines SBL becomes higher than that of inverted sense bit lines SBLB. During first read period RT1, a charge operation is performed on bit lines BL and inverted bit lines BLB of the two memory pair groups.

Next, controller 400 generates bit line isolation control signal ISOA1 with a voltage level for turning on NMOS transistors N1 and N2 of bit line isolation gates ISOG1. Controller 400 also generates bit line isolation control signal ISOB1 with a voltage level for turning off NMOS transistors N3 and N4 of bit line isolation gate ISOG1. Further, row decoder 200 supplies the word line selection signal with a negative voltage (e.g., about −1.8 or −2 V) to word line WL11.

During a second read period RT2, controller 400 supplies predetermined sense enable control voltages LA1 and LA12 (e.g., about 2 V) and predetermined sense enable control voltages LAB1 and LAB12 (e.g., about 0 V) to sense amplifiers SA1 and SA12 located at opposite sides of memory cell array block BK1. Then, sense amplifiers SA1 and SA12 sense a high-level voltage of sense bit lines SBL, and amplify the voltage level of inverted sense bit lines SBLB to a predetermined voltage level (e.g., about 0 V). Further, sense amplifiers SA1 and SA12 sense a low-level voltage of inverted sense bit lines SBLB, and amplify the voltage level of sense bit lines SBL to a predetermined voltage level (about 2 V). At this time, since NMOS transistors N1 and N2 of bit line isolation gates ISOG1 are turned on, bit lines BL and inverted bit lines BLB are also amplified to the same level as sense bit lines SBL and inverted sense bit lines SBLB. In second read period RT2, an amplification operation is performed on the pairs of bit lines BL and BLB and the pairs of sense bit lines SBL and SBLB.

During a third read period RT3, column decoder 300 decodes column address CA and generates the column selection signal for selecting column selection signal line CSL1. Then, column selection gates CSG1 and CSG12 located at opposite sides of memory cell array block BK1 are turned on and transmit data in the pairs of sense bit lines SBL and SBLB of the two memory pair groups to the pairs of data input/output lines (DO1, DOB1) and (DO12, DOB12).

In second and third read periods RT2 and RT3, NMOS transistors N11 of the two memory pair groups are turned on in response to a predetermined voltage of amplified bit lines BL, so that a predetermined voltage (e.g., about 0 V) is applied to first source lines SL1. At this time, since a negative voltage is applied to the gates of memory cells FN1 of the two memory pair groups and a positive voltage is applied to bit lines BL, a GIDL current is generated in memory cells FN1, thereby re-storing data "1".

Next, controller 400 generates bit line isolation control signal ISOA1 with a voltage level for turning off NMOS transistors N1 and N2 of bit line isolation gates ISOG1, and cuts off the application of sense enable control voltages LA1, LA12, LA23, ..., and LAB12. Column decoder 300 disables the column selection signal for selecting column selection signal line CSL1, and row decoder 200 sends the word selection signal for selecting the word line WL11 to a predetermined voltage level (e.g., about 1.8 or 2 V).

During a fourth read period RT4, data "0" is re-stored through the same operation as described with reference to FIG. 3B.

In semiconductor memory devices according to selected embodiments of the invention as described above, instead of writing (re-storing) data "0" by applying a negative voltage to the bit line (inverted bit line), while the application of a voltage to the bit line (inverted bit line) is being cut off, the voltage of the bit line (inverted bit line) varies with the voltage of the inverted bit line (bit line), so that a negative voltage is caused in the bit line (inverted bit line), thereby writing (re-storing) data "0".

Furthermore, in the semiconductor memory devices according to selected embodiments of the invention, in order to perform the data read operation, a pair of bit lines are precharged to a predetermined voltage level to turn on a transmission gate, a voltage difference between the pair of bit lines is caused by a current difference due to a difference in threshold voltage between memory cells according to stored data, and the voltage difference between the pair of bit lines is amplified, thereby reading the data.

As described above, in the semiconductor memory device according to selected embodiments of the invention, an operation for writing data "1" may be performed due to a GIDL current instead of using impact ionization.

In FIG. 2, the memory cell array of the semiconductor memory device is configured such that one memory cell array block is selected and two pairs of data are output from the selected memory cell array block. However, the memory cell array may be configured in a variety of ways. For example, the memory cell array may be configured such that 8 data pairs may be output from two memory cell array blocks.

The memory cell array of the semiconductor memory device illustrated in selected embodiments described above may include the memory pair groups, the bit line isolation gates, and the precharge circuit shown in FIG. 2, and further include bit line sense amplifiers and column selection gates.

According to the embodiments described above, a semiconductor memory device including a capacitor-less dynamic memory cell does not need a negative voltage generator because it is unnecessary to apply a negative voltage to a bit line during writing (or re-storing) of data "0".

Also, semiconductor memory devices according to selected embodiments require a simple circuit configuration for a read operation.

The foregoing embodiments are teaching examples. Those of ordinary skill in the art will understand that various changes in form and details may be made to the exemplary embodiments without departing from the scope of the invention as defined by the following claims.

What is claimed:

1. A semiconductor memory device, comprising:
    a first memory cell configured to store a first bit of data and comprising a floating body, a gate connected to a word line, a first electrode connected to a bit line, and a second electrode connected to a first source line;
    a second memory cell configured to store a second bit of data having an inverted logic state relative to the first bit of data and comprising a floating body, a gate connected to the word line, a first electrode connected to an inverted bit line, and a second electrode connected to a second source;
    a first transmission gate configured to turn on in response to a voltage applied to a common source line or a voltage applied to the bit line to connect the common source line with the first source line;
    a second transmission gate configured to turn on in response to the voltage applied to the common source line or a voltage applied to the inverted bit line to connect the common source line with the second source line;
    a bit line isolation gate configured to connect the bit line and the inverted bit line with a sense bit line and an inverted sense bit line, respectively, during a write operation, and further configured to connect the bit line and the inverted bit line with the inverted sense bit line and the sense bit line, respectively, and then to connect the bit line and the inverted bit line with the sense bit line and the inverted sense bit line, respectively, during a read operation, wherein the connections of the bit line and inverted bit line with the sense bit line and the inverted sense bit line are controlled by a bit line isolation control signal; and
    a precharge circuit configured to precharge the sense bit line and the inverted sense bit line to a precharge voltage level in response to a precharge control signal.

2. The device of claim 1, wherein the first and second memory cells write and re-store data "1" using impact ionization, and write and re-store data "0" using a forward bias voltage.

3. The device of claim 2, further comprising a controller; wherein the controller is configured to:
enable the precharge control signal before and after the write and read operations;
apply a first voltage to the common source line and a second voltage to the word line during first and second write periods of the write operation;
apply the bit line isolation control signal to connect the bit line and the inverted bit line with the sense bit line and the inverted sense bit line, respectively, during the first write period;
amplify a voltage difference between the sense bit line and the inverted sense bit line during the first write period to apply a third voltage to one of the sense bit line and the inverted sense bit line and apply the first voltage to the other of the sense bit line and the inverted sense bit line;
disable the bit line isolation control signal during the second write period to cut off the application of a voltage to the bit line and the inverted bit line;
apply the first voltage to the common source line and the second voltage to the word line during first through fourth read periods of the read operation;
apply the bit line isolation control signal to connect the bit line and the inverted bit line with the inverted sense bit line and the sense bit line, respectively, during the first read period, and to connect the bit line and the inverted bit line with the sense bit line and the inverted sense bit line, respectively, during the second and third read periods;
disable the bit line isolation control signal during the fourth read period to cut off the application of a voltage to the bit line and the inverted bit line; and
amplify a voltage difference between the sense bit line and the inverted sense bit line during the second and third read periods to apply the third voltage to one of the sense bit line and the inverted sense bit line and apply the first voltage to the other of the sense bit line and the inverted sense bit line.

4. The device of claim 3, wherein the second voltage is higher than the first voltage and lower than the third voltage.

5. The device of claim 1, wherein the first and second memory cells write and re-store data "1" using a gate-induced drain leakage (GIDL) current, and write and re-store data "0" using a forward bias voltage.

6. The device of claim 5, further comprising a controller; wherein the controller is configured to:
enable the precharge control signal before and after the write and read operations;
apply a first voltage to the common source line during first and second write periods of the write operation;
apply a negative second voltage to the word line during the first write period, and applying the second voltage to the word line during the second write period;
apply the bit line isolation control signal to connect the bit line and the inverted bit line with the sense bit line and the inverted sense bit line, respectively, during the first write period;
amplify a voltage difference between the sense bit line and the inverted sense bit line during the first write period to apply a third voltage to one of the sense bit line and the inverted sense bit line and apply the first voltage to the other of the sense bit line and the inverted sense bit line;
disable the bit line isolation control signal during the second write period to cut off the application of a voltage to the bit line and the inverted bit line;
apply the first voltage to the common source line during first through fourth read periods of the read operation;
apply the second voltage to the word line during the first and fourth read periods and applying the negative second voltage to the word line during the second and third read periods;
apply the bit line isolation control signal to connect the bit line and the inverted bit line with the inverted sense bit line and the sense bit line, respectively, during the first read period and connect the bit line and the inverted bit line with the sense bit line and the inverted sense bit line, respectively, during the second and third read periods;
disable the bit line isolation control signal during the fourth read period to cut off the application of a voltage to the bit line and the inverted bit line; and
amplify a voltage difference between the sense bit line and the inverted sense bit line during the second and third read periods to apply the third voltage to one of the sense bit line and the inverted sense bit line and apply the first voltage to the other of the sense bit line and the inverted sense bit line.

7. The device of claim 6, wherein the second voltage is less than the first voltage and the third voltage.

8. A semiconductor memory device comprising:
a first memory cell configured to store a first bit of data and comprising a floating body, a gate connected to a word line, a first electrode connected to a bit line, and a second electrode connected to a first source line;
a second memory cell configured to store a second bit of data having an inverted logic state relative to the first bit of data and comprising a floating body, a gate connected to the word line, a first electrode connected to an inverted bit line, and a second electrode connected to a second source;
a first transmission gate configured to turn on in response to a voltage applied to a common source line or a voltage applied to the bit line to connect the common source line with the first source line;
a second transmission gate configured to turn on in response to the voltage applied to the common source line or a voltage applied to the inverted bit line to connect the common source line with the second source line;
a bit line isolation gate configured to connect the bit line and the inverted bit line with a sense bit line and an inverted sense bit line, respectively, during a write operation, and further configured to connect the bit line and the inverted bit line with the inverted sense bit line and the sense bit line, respectively, and then to connect the bit line and the inverted bit line with the sense bit line and the inverted sense bit line, respectively, during a read operation, wherein the connections of the bit line and inverted bit line with the sense bit line and the inverted sense bit line are controlled by a bit line isolation control signal;
a precharge circuit configured to precharge the sense bit line and the inverted sense bit line to a precharge voltage level in response to a precharge control signal; and
a bit line sense amplifier configured to receive a sense enable control signal and amplify a voltage difference between the sense bit line and the inverted sense bit line; and
a column selection gate configured to transmit data between the sense bit line and a data input/output line and between the inverted sense bit line and an inverted data input/output line in response to a column selection signal.

9. The device of claim 8, wherein the first and second memory cells write and re-store data "1" using impact ionization, and write and re-store data "0" using a forward bias voltage.

10. The device of claim 9, further comprising a controller: wherein the controller is configured to:
enable the precharge control signal before and after the write and read operations;
apply a first voltage and a second voltage to the common source line and the word line, respectively, during first and second write periods of the write operation;
apply the bit line isolation control signal to connect the bit line and the inverted bit line with the sense bit line and the inverted sense bit line, respectively, during the first write period;
apply the sense enable control voltage;
enable the column selection signal;
disable the bit line isolation control signal during the second write period to cut off the application of a voltage to the bit line and the inverted bit line;
apply the first voltage and the second voltage to the common source line and the word line, respectively, during first through fourth read periods of the read operation;
applying the bit line isolation control signal to connect the bit line and the inverted bit line with the inverted sense bit line and the sense bit line, respectively, during the first read period and connect the bit line and the inverted bit line with the sense bit line and the inverted sense bit line, respectively, during the second and third read periods;
disable the bit line isolation control signal during the fourth read period;
apply the sense enable control voltage during the second and third read periods; and
enable the column selection signal during the third read period.

11. The device of claim 10, wherein the second voltage is higher than the first voltage.

12. The device of claim 9, wherein the first and second memory cells write and re-store data "1" using a gate-induced drain leakage (GIDL) current, and write and re-store data "0" using a forward bias voltage.

13. The device of claim 12, further comprising a controller: wherein the controller is configured to:
enable the precharge control signal before and after the write and read operations;
apply a first voltage to the common source line during first and second write periods of the write operation;
apply a negative second voltage to the word line during the first write period, and applying the second voltage to the word line during the second write period;
apply the bit line isolation control signal to connect the bit line and the inverted bit line with the sense bit line and the inverted sense bit line, respectively, during the first write period;
apply the sense enable control voltage;
enable the column selection signal;
disable the bit line isolation control signal during the second write period to cut off the application of a voltage to the bit line and the inverted bit line;
apply the first voltage to the common source line during first through fourth read periods of the read operation;
apply the second voltage to the word line during the first and fourth read periods, and applying the negative second voltage to the word line during the second and third read periods;
apply the bit line isolation control signal to connect the bit line and the inverted bit line with the inverted sense bit line and the sense bit line, respectively, during the first read period and connect the bit line and the inverted bit line with the sense bit line and the inverted sense bit line, respectively, during the second and third read periods;
disable the bit line isolation control signal during the fourth read period;
apply the sense enable control voltage during the second and third read periods; and
enable the column selection signal during the third read period.

14. The device of claim 13, wherein the second voltage is less than the first voltage.

15. A data read and write method for a semiconductor memory device comprising: a first memory cell configured to store a first bit of data and comprising a floating body, a gate connected to a word line, a first electrode connected to a bit line, and a second electrode connected to a first source line; and a second memory cell configured to store a second bit of data having an inverted logic state relative to the first bit of data and comprising a floating body, a gate connected to the word line, a first electrode connected to an inverted bit line, and a second electrode connected to a second source line;
the method comprising:
a data write step comprising amplifying signals apparent on a sense bit line and an inverted sense bit line, and transmitting the amplified signals to the bit line and the inverted bit line, respectively, to write data "1" to one of the first and second memory cells during a first write period and to write data "0" in the other of the first and second memory cells during a second write period; and
a data read step comprising precharging the bit line and the inverted bit line to a precharge voltage level, generating a voltage difference between the bit line and the inverted bit line and transmitting the voltage difference to the inverted sense bit line and the sense bit line during a first read period, amplifying a voltage difference between the sense bit line and the inverted sense bit line and transmitting the voltage difference to the bit line and the inverted bit line during second and third read periods to re-store data "1" in one of the first and second memory cells where the data "1" is stored, and cutting off the application of a voltage to the bit line and the inverted bit line during a fourth read period to re-store data "0" in one of the first and second memory cells where the data "0" is stored.

16. The method of claim 15, wherein the data write step further comprises:
applying a first voltage to a common source line and a second voltage to the word line, connecting the bit line and the inverted bit line to the sense bit line and the inverted sense bit line, respectively, applying a third voltage generated by amplifying high-level data to one of the sense bit line and the inverted sense bit line, and applying the first voltage generated by amplifying low-level data to the other of the sense bit line and the inverted sense bit line to write data "1" to one of the first and second memory cells during the first write period; and
applying the first voltage to the common source line and the second voltage to the word line, and writing data "0" to the other of the first and second memory cells due to coupling between the bit line and the inverted bit line when the application of a voltage to the bit line and the inverted bit line is cut off by disconnecting the bit line and the inverted bit line from the sense bit line and the inverted sense bit line, respectively, during the second write period.

17. The method of claim 16, wherein the data read step further comprises:
applying the first voltage to a common source and the second voltage to the word line to generate a voltage difference between the bit line and the inverted bit line due to a current difference between the first and second memory cells, and connecting the bit line and the inverted bit line to the inverted sense bit line and the sense bit line, respectively, during the first read period;
applying the first voltage to the common source line and the second voltage to the word line, sensing and amplifying a voltage difference between the sense bit line and the inverted sense bit line, and connecting the sense bit line and the inverted sense bit line to the bit line and the inverted bit line, respectively, to re-store data "1" in one of the first and second memory cells where the data "1" is stored during the second and third read periods; and
applying the first voltage to the first and second source lines and the second voltage to the word line to re-store data "0" in one of the first and second memory cells where the data "0" is stored due to coupling between the bit line and the inverted bit line when the application of a voltage to the bit line and the inverted bit line is cut off by disconnecting the bit line and the inverted bit line from the sense bit line and the inverted sense bit line, respectively, during the fourth read period.

18. The method of claim 17, wherein the second voltage is higher than the first voltage and lower than the third voltage.

19. The method of claim 17, wherein the data read step further comprises:
sensing and amplifying a voltage difference between the sense bit line and the inverted sense bit line during the second read period; and
outputting signals apparent on the sense bit line and the inverted sense bit line, respectively, and re-storing data "1" in one of the first and second memory cells where the data "1" is stored during the third read period.

20. The method of claim 15, wherein the data write step further comprises:
applying a first voltage to a common source line and a negative second voltage to the word line, connecting the bit line and the inverted bit line to the sense bit line and the inverted sense bit line, respectively, applying a third voltage generated by amplifying high-level data to one of the sense bit line and the inverted sense bit line, and applying the first voltage generated by amplifying low-level data to the other of the sense bit line and inverted sense bit line to write data "1" to one of the first and second memory cells during the first write period; and
applying the first voltage to the common source line and the second voltage to the word line, and writing data "0" to the other of the first and second memory cells due to coupling between the bit line and the inverted bit line when the application of a voltage to the bit line and the inverted bit line is cut off by disconnecting the bit line and the inverted bit line from the sense bit line and the inverted sense bit line, respectively, during the second write period.

21. The method of claim 20, wherein the data read step comprises:
applying the first voltage to a common source line and the second voltage to the word line to generate a voltage difference between the bit line and the inverted bit line due to a current difference between the first and second memory cells, and connecting the bit line and the inverted bit line to the inverted sense bit line and the sense bit line, respectively, during the first read period;
applying the first voltage to the common source line and the negative second voltage to the word line, sensing and amplifying a voltage difference between the sense bit line and the inverted sense bit line, and connecting the sense bit line and the inverted sense bit line to the bit line and the inverted bit line, respectively, to re-store data "1" in one of the first and second memory cells where the data "1" is stored during the second and third read periods; and
applying the first voltage to the first and second source lines and the second voltage to the word line, and re-storing data "0" in one of the first and second memory cells where the data "0" is stored due to coupling between the bit line and the inverted bit line when the application of a voltage to the bit line and the inverted bit line is cut off by disconnecting the bit line and the inverted bit line from the sense bit line and the inverted sense bit line, respectively during the fourth read period.

22. The method of claim 21, wherein the second voltage is higher than the first voltage and lower than the third voltage.

23. The method of claim 21, wherein the data read step further comprises:
sensing and amplifying a voltage difference between the sense bit line and the inverted sense bit line during the second read period; and
outputting the signals apparent on the sense bit line and the inverted sense bit line, and re-storing data "1" in one of the first and second memory cells where the data "1" is stored during the third read period.

* * * * *